US008276254B2

(12) United States Patent
Miles

(10) Patent No.: US 8,276,254 B2
(45) **Date of Patent: *Oct. 2, 2012**

(54) SURFACE MICROMACHINED DIFFERENTIAL MICROPHONE

(75) Inventor: Ronald N. Miles, Newark Valley, NY (US)

(73) Assignee: The Research Foundation of State University of New York, Binghamton, NY (US)

( * ) Notice: Subject to any disclaimer, the term of this patent is extended or adjusted under 35 U.S.C. 154(b) by 1085 days.

This patent is subject to a terminal disclaimer.

(21) Appl. No.: 12/162,992

(22) PCT Filed: Jan. 25, 2007

(86) PCT No.: PCT/US2007/001915
§ 371 (c)(1),
(2), (4) Date: Jul. 31, 2008

(87) PCT Pub. No.: WO2007/089505
PCT Pub. Date: Aug. 9, 2007

(65) Prior Publication Data
US 2009/0046883 A1 Feb. 19, 2009

(51) Int. Cl.
*H01L 31/00* (2006.01)
*H04R 3/00* (2006.01)

(52) U.S. Cl. .......... 29/594; 381/113; 381/174; 381/424; 381/431

(58) Field of Classification Search ........................ None
See application file for complete search history.

(56) References Cited

U.S. PATENT DOCUMENTS 5,573,679 A * 11/1996 Mitchell et al. .................. 216/2
5,839,062 A 11/1998 Nguyen et al.
5,952,974 A 9/1999 Ito et al.
5,955,668 A 9/1999 Hsu et al.
6,257,059 B1 7/2001 Weinburg et al.
6,567,572 B2 5/2003 Degertekin et al.
6,578,420 B1 6/2003 Hsu
6,627,965 B1 * 9/2003 Tuller et al. .................. 257/415
6,788,796 B1 * 9/2004 Miles et al. .................. 381/357
7,545,945 B2 * 6/2009 Miles ............................ 381/174
7,876,924 B1 * 1/2011 Miles et al. .................. 381/423
7,992,283 B2 * 8/2011 Miles ............................ 29/524
2002/0189352 A1 12/2002 Reeds et al.

(Continued)

OTHER PUBLICATIONS

Cui, et al., Optical Sensing in a Directional MEMS Microphone Inspired by the Ears of the Parasitoid Fly, Ormia Ochracea:, Jan. 2006.

(Continued)

*Primary Examiner* — Alonzo Chambliss
(74) *Attorney, Agent, or Firm* — Steven M. Hoffberg; Ostrolenk Faber LLP

(57) ABSTRACT

A method of forming a miniature, surface micromachined, differential microphone, comprising depositing a sacrificial layer on a surface of a silicon wafer; depositing a diaphragm material on a surface of the sacrificial layer; etching the diaphragm material layer to isolate a diaphragm; and removing a portion of the sacrificial layer beneath the defined diaphragm. A diaphragm formed in the diaphragm material layer is supported by a hinge and otherwise isolated from a remaining portion of the diaphragm material layer by a slit adjacent a perimeter of the diaphragm. An enclosed back volume beneath the diaphragm has a depth defined by a thickness of the sacrificial layer, and communicates with an external region via the slit. A transducer may be provided for producing an electrical signal responsive to a displacement of the diaphragm.

20 Claims, 6 Drawing Sheets

U.S. PATENT DOCUMENTS

| | | | |
|---|---|---|---|
| 2004/0231420 | A1 | 11/2004 | Xie et al. |
| 2005/0051910 | A1 | 3/2005 | Goto et al. |
| 2005/0072231 | A1 | 4/2005 | Chojnacki et al. |
| 2005/0109107 | A1 | 5/2005 | Park |

OTHER PUBLICATIONS

Lee, et al., "Rigorous Coupled-wave Analysis of Multilayered Grating Structures", IEEE Journal of Lightwave Technology, 22, pp. 2359-2363, 2004.

Hall, et al., "An Integrated Optical Detection Method for Capacitive Micromachined Ultrasonic Transducers", Proceedings of 2000 IEEE Ultrasonics Symposium, pp. 951-954, 2000.

Hall, et al., "An Integrated Optical Interferometric Detection Method for Micromachined Capacitive Acoustic Transducers", Appl. Phys. Lett., 80, pp. 3859-3861, 2002.

http://www.ulm-photonics.de.

Sung, et al., "CMOS Compatible Directional Microphone", Microsystems, Packaging, Assembly and Circuits Technology, 2007, Impact 2007, pp. 149-152, 2007.

* cited by examiner

SURFACE MICROMACHINED DIFFERENTIAL MICROPHONE

FUNDED RESEARCH

This work is supported in part by the following grant from the National Institute of Health: R01DC005762-03. The Government may have certain rights in this invention.

RELATED APPLICATIONS

The present application is related to U.S. Pat. No. 6,788,796 for DIFFERENTIAL MICROPHONE, issued Sep. 7, 2004; and copending U.S. patent application Ser. No. 10/689,189 for ROBUST DIAPHRAGM FOR AN ACOUSTIC DEVICE, filed Oct. 20, 2003, and Ser. No. 11/198,370 for COMB SENSE MICROPHONE, filed Aug. 5, 2005, all of which are incorporated herein by reference.

FIELD OF THE INVENTION

The present invention pertains to differential microphones and, more particularly, to a micromachined, differential microphone absent a backside air pressure relief orifice, fabricatable using surface micromachining techniques.

BACKGROUND OF THE INVENTION

In typical micromachined microphones of the prior art, it is generally necessary to maintain a significant volume of air behind the microphone diaphragm in order to prevent the back volume air from impeding the motion of the diaphragm. The air behind the diaphragm acts as a linear spring whose stiffness is inversely proportional to the nominal volume of the air. In order to make this air volume as great as possible, and hence reduce the effective stiffness, a through-hole is normally cut from the backside of the silicon chip. The requirement of this backside hole adds significant complexity and expense to such prior art micromachined microphones. This present invention enables creation of a microphone that does not require a backside hole. Consequently, the inventive microphone may be fabricated using only surface micromachining techniques.

SUMMARY OF THE INVENTION

In accordance with the present invention, there is provided a differential microphone having a perimeter slit formed around the microphone diaphragm. Because the motion of the diaphragm in response to sound does not result in a net compression of the air in the space behind the diaphragm, the use of a very small backing cavity is possible, thereby obviating the need for creating a backside hole. The backside holes of prior art microphones typically require that a secondary machining operation be performed on the silicon chip during fabrication. This secondary operation adds complexity and cost to, and results in lower yields of the microphones so fabricated. Consequently, the microphone of the present invention requires surface machining from only a single side of the silicon chip.

BRIEF DESCRIPTION OF THE DRAWINGS

A complete understanding of the present invention may be obtained by reference to the accompanying drawings, when considered in conjunction with the subsequent, detailed description, in which.

DETAILED DESCRIPTION OF THE PREFERRED EMBODIMENT

The present invention relates to a micromachined differential microphone formed by surface micromachining a single surface of a silicon chip.

The motion of a typical microphone diaphragm results in a fluctuation in the net volume of air in the region behind the diaphragm (i.e., the back volume). The present invention provides a microphone diaphragm designed to rock due to acoustic pressure, and hence does not significantly compress the back volume air.

An analytical model for the acoustic response of the microphone diaphragm including the effects of a slit around the perimeter and the air in the back volume behind the diaphragm has been developed. If the diaphragm is designed to rock about a central pivot, then the back volume and the slit has a negligible effect on the sound-induced response thereof.

Figure 1:
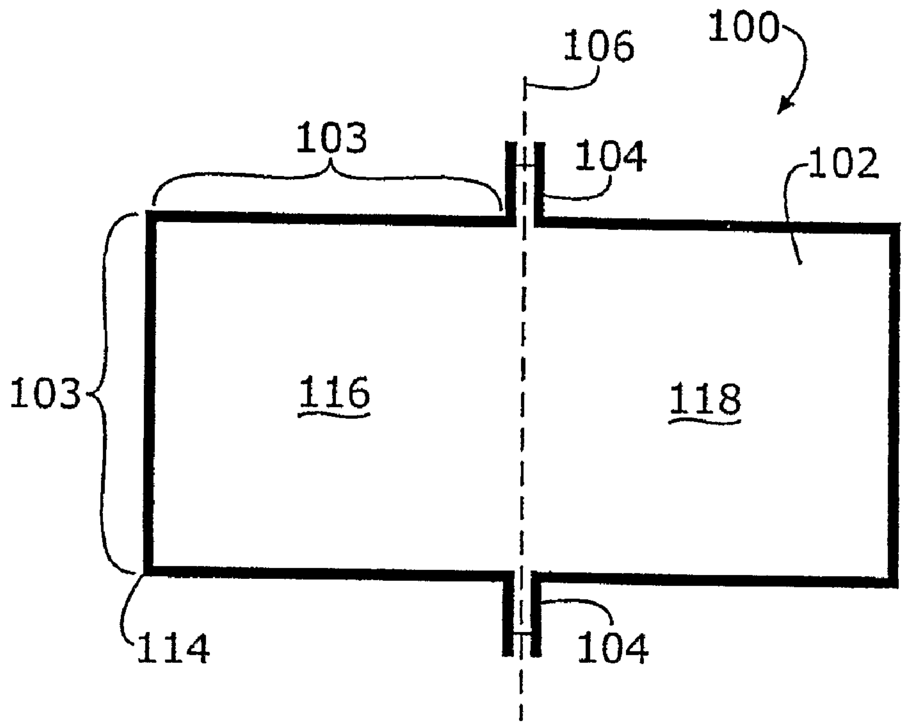
FIG. 1 is a top view of a micromachined microphone diaphragm in accordance with the invention.
Figure 2:
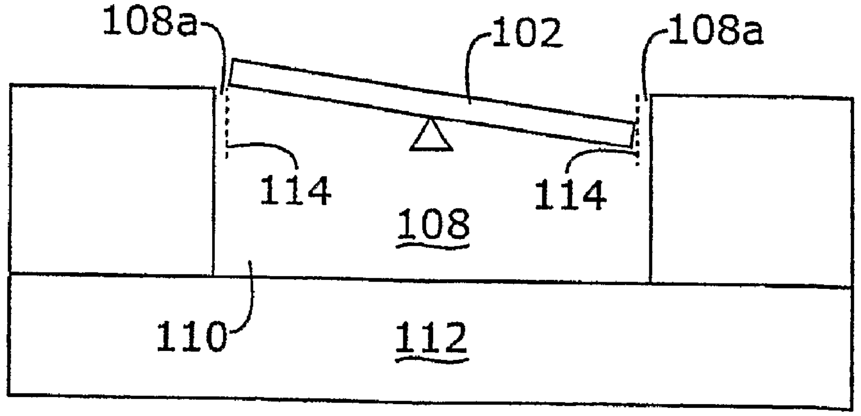
FIG. 2 is a side, sectional, schematic view of a differential microphone of the invention.

Referring first to FIGS. 1 and 2, there are shown, respectively, a top view of a micromachined microphone diaphragm, including a slit around the perimeter of the diaphragm, and a side, sectional, schematic view of a differential microphone in accordance with the invention, generally at reference number 100. A rigid diaphragm 102 is supported by hinges 104 that form a pivot point 106 around which diaphragm 102 may "rock" (i.e., reciprocally rotate). A back volume of air 108 is formed in a cavity 110 formed in the chip substrate 112. A slit 114 is formed between the perimeter 103 of diaphragm 102 and the chip substrate 112.

Diaphragm 102 rotates about the pivot point 106 due to a net moment that results from the difference in the acoustic pressure that is incident on the top surface portions 116, 118 that are separated by the central pivot point 106.

In order to more readily examine the effects of the back volume 108 and the slit 114 around the diaphragm 102, several assumptions are made. It is assumed that the pivot point 106 is centrally located and that diaphragm 102 is designed such that the rocking, or out-of-phase motion of diaphragm 102 is the result of the pressure difference on the two portions 116, 118 of the exterior surface thereof. Because diaphragm 102 is normally designed to respond to the difference in pressure on its two portions 116, 118, microphone 100 is referred to it as a differential microphone. However, in addition to motion induced by pressure differences, it is also possible that diaphragm 102 will be deflected due to the average pressure on its exterior surface. Such pressure causes diaphragm 102 motion in which both portions 116, 118 of the diaphragm 102 separated by the pivot point 106 respond in-phase.

Figure 3:
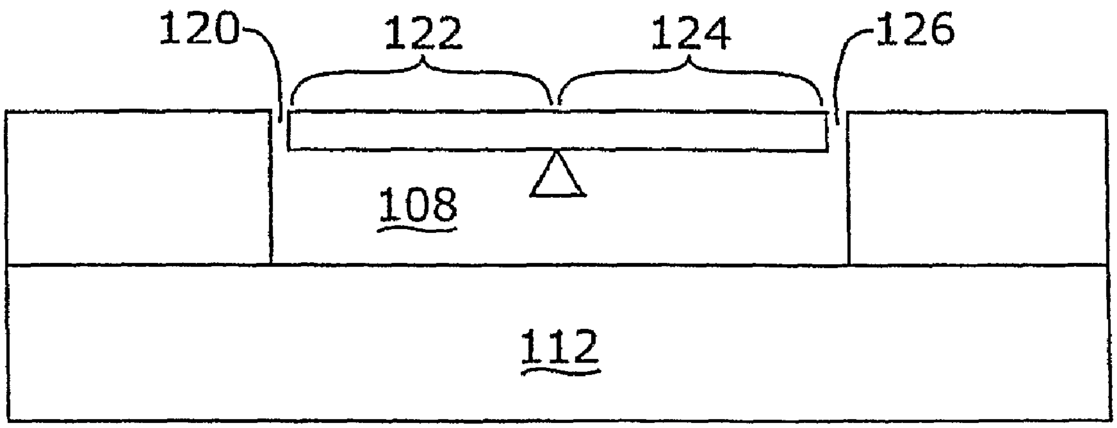
FIGS. 3 and 4 are, respectively, schematic representations of the differential microphone of FIG. 2 as a series of diaphragms without and with an indication of the motion thereof.
Figure 4:
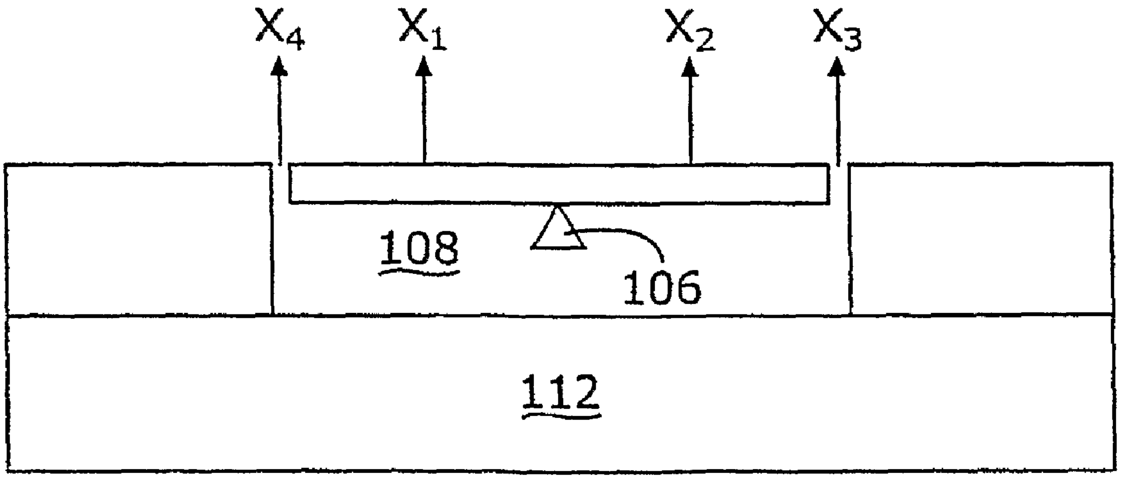

The air 108*a* in the slit 114 around the diaphragm 102 on each portion 116, 118 is assumed to have a mass ma. Consequently, diaphragm 102 responds like an oscillator. Hence, the two portions 116, 118 of the differential microphone 100, along with the two masses of air 108, 108*a* can be represented by a system of diaphragms 120, 122, 124, 126 as shown in FIG. 3. Each of the diaphragms is identified as air 108 (reference number 120), microphone portion 116 (reference number 122), microphone portion 118 (reference number 124), and air 108*a* (reference number 126). The response of each diaphragm is governed by the following equation:

$$m_i\ddot{X}_i+k_iX_i=F_i \qquad (1)$$

where: $F_i$ is the net force acting on each diaphragm 120, 122, 124, 126 and $X_4$, $X_1$, $X_2$, and $X_3$, represent the motion of each respective diaphragm 120, 122, 124, 126. As may be seen in FIG. 4, $X_1$ and $X_2$ represent the average motion of each portion 116, 118 of the diaphragm and $X_3$ and $X_4$ represent the motion of the air 108*a* in the slit 114.

A differential microphone without the slit 114 (i.e., a differential microphone of the prior art) can be represented by a two degree of freedom system with rotational response θ and translational response x:

$$m\ddot{x}+kx=F \qquad (2a)$$

$$I\ddot{\theta}+k_t\theta=M \qquad (2b)$$

where: F is the net applied force, and M is the resulting moment about the pivot point. k and $k_t$ represent the effective transverse mechanical stiffness and the torsional stiffness respectively, of the diaphragm and pivot 102, and 106.

If d is the distance between the centers of each portion 116, 118 of the diaphragm 102, then $X_1$ and $X_2$ may be expressed in terms of the generalized co-ordinates x and θ:

$$X_1=x+\frac{d}{2}\theta \text{ and } X_2=x-\frac{d}{2}\theta \;\Rightarrow\; x=\frac{X_1+X_2}{2} \text{ and } \theta=\frac{X_1-X_2}{2} \qquad (3)$$

These relations may also be written in matrix form:

$$\begin{pmatrix} X_1\\ X_2\\ X_3\\ X_4 \end{pmatrix}=\begin{bmatrix} d/2 & 1 & 0 & 0\\ -d/2 & 1 & 0 & 0\\ 0 & 0 & 1 & 0\\ 0 & 0 & 0 & 1 \end{bmatrix}\begin{pmatrix} \theta\\ x\\ X_3\\ X_4 \end{pmatrix}=[T]\begin{pmatrix} \theta\\ x\\ X_3\\ X_4 \end{pmatrix} \qquad (4)$$

If the dimensions of the air cavity 110 (FIG. 2) behind the diaphragm 102 are much smaller than the wavelength of sound, it may be assumed that the air pressure in the back volume 108 is spatially uniform within the air cavity. The air 108 in this back volume (i.e., cavity 110) then acts as a linear spring. It is necessary to relate the pressure in the back volume air 108 to the displacement of the diaphragm 102 to estimate the stiffness of this spring. If the mass of the air in back volume 108 is assumed to be constant, then the motion of the diaphragm 102 results in a change in the density of the air 108 in cavity 110. The relation between the acoustic, or fluctuating density, $\rho_a$ and the acoustic pressure, p, is the equation of state:

$$p=c^2\rho_a \qquad (5)$$

where: c is the speed of sound.

The total density of air is the mass divided by the volume, ρ=M/V. If the volume fluctuates by an amount ΔV due to the motion of diaphragm 102, then the density becomes ρ=M/(V+ΔV)=M/V(1+ΔV/V. For small changes in the volume, this can be expanded in a Taylor's series ⇒ρ≈(M/V(1−ΔV/V). The acoustic fluctuating density is then $\rho_a=-\rho_0\Delta V/V$, where the nominal density is $\rho_0=M/V$. The fluctuating pressure in the volume V due to the fluctuation ΔV, resulting from an outward motion, x, of the diaphragm 102 is then given by:

$$P_d=-\rho_0c^2\Delta V/V=-\rho_0c^2Ax/V \qquad (6)$$

where: A is half the area of the diaphragm.

This pressure in the back volume 108 exerts a force on the diaphragm 102 given by:

$$F_d=P_dA-\rho_0c^2A^2x/V=-K_dx \qquad (7)$$

where: $K_d=\rho_0c^2A^2/V$ is the equivalent spring constant of the air 108 with units of N/m.

The force due to the back volume of air 108 adds to the restoring force from the mechanical stiffness of the diaphragm 102. Including the air in the back volume 108, Equation (2) becomes:

$$m\ddot{x}+kx+k_dx=-PA \qquad (8)$$

The negative sign on the right hand side of Equation (8) is attributed to the convention that a positive pressure on the diaphragm's exterior causes a force in the negative direction. From Equation (8), the mechanical sensitivity at frequencies well below the resonant frequency is given by $S_m=A/(k+K_d)$ m/Pa.

The air 108*a* in the slit or vent 114 is forced to move due to the fluctuating pressures both within the space 110 behind the diaphragm 102 and in the external sound field, not shown. Again, it may be assumed that the dimensions of the volume of moving air in the slit 114 to be much smaller than the wavelength of sound and hence it may be approximately represented as a lumped mass ma. An outward displacement, $x_a$, of the air 108*a* in the slit 114 causes a change in the volume of air in the back volume 108. A corresponding pressure similar to Equation (6) is given by:

$$P_{aa}=-\rho_0c_2A_ax_a/V \qquad (9)$$

where: $A_a$ is the area of the slit 114 on which the pressure acts.

Again, the pressure due to motion of air 108*a* in the slit 114 applies a restoring force on the mass thereof given by:

$$F_{aa}=P_{aa}A_a=-\rho_0c^2A_a^2X_a/V=K_{aa}x_a \qquad (10)$$

Since the pressure in the back volume 108 is nearly independent of position within the back volume, a change in the pressure due to motion of the air 108*a* in the slit 114 exerts a force on the diaphragm 102 given by:

$$F_{ad}=P_{aa}A=-\rho_0c^2A_aAx_a/V=K_{ad}x_a \qquad (11)$$

Similarly, the motion of the diaphragm causes a force on the mass of air 108 given by:

$$F_{da}=P_dA_a=-\rho_0c^2AA_ax/V=-K_{da}x \qquad (12)$$

From Equations (6), (10), (11) and (12), it may be seen that the forces add to the restoring forces due to mechanical stiffness in the system of Equation (1). Hence the volume change due to motion of each co-ordinate is given by $\Delta V_i=A_iX_i$ and $F_i=PA_i$. Now, the total pressure due to the motion of all co-ordinates is given by:

$$P_{tot} = -\frac{\rho_0 c^2}{V}(A_1X_1 + A_2X_2 + A_3X_3 + A_4X_4) = -\frac{\rho_0 c^2}{V}\sum_i A_iX_i \tag{13}$$

The force due to this pressure on the jth coordinate in this model (indicating the motions of 120, 122, 124, and 126 in FIG. 3) is then given by:

$$F_j = P_{tot}A_j = \left(-\frac{\rho_0 c^2}{V}\sum_i A_iX_i\right)A_j = -\sum_i K_{ij}X_i \tag{14}$$

where:

$$K_{ij} = -\frac{\rho_0 c^2}{V}A_iA_j.$$

Equation (14) may be written as:

$$\begin{pmatrix} F_1 \\ F_2 \\ F_3 \\ F_4 \end{pmatrix} = -\begin{bmatrix} K_{11} & K_{12} & K_{13} & K_{14} \\ K_{21} & K_{22} & K_{23} & K_{24} \\ K_{31} & K_{32} & K_{33} & K_{34} \\ K_{41} & K_{42} & K_{43} & K_{44} \end{bmatrix}\begin{pmatrix} X_1 \\ X_2 \\ X_3 \\ X_4 \end{pmatrix} \tag{15}$$

Combining Equations (4) and (15), in terms of the coordinates θ and x of the differential microphone, the force is represented as:

$$\begin{pmatrix} F_1 \\ F_2 \\ F_3 \\ F_4 \end{pmatrix} = -\begin{bmatrix} K_{11} & K_{12} & K_{13} & K_{14} \\ K_{21} & K_{22} & K_{23} & K_{24} \\ K_{31} & K_{32} & K_{33} & K_{34} \\ K_{41} & K_{42} & K_{43} & K_{44} \end{bmatrix}[T]\begin{pmatrix} \theta \\ x \\ X_3 \\ X_4 \end{pmatrix} \tag{16}$$

Equation (16) may be rewritten in terms of the average force acting on the differential microphone 100 and the net moment acting on the pivot point 106. This is given by:

$$F = \frac{F_1 + F_2}{2} \text{ and } M = (F_1 - F_2)\frac{d}{2} \Rightarrow F_1 = F + \frac{M}{d} \text{ and}$$
$$F_2 = F - \frac{M}{d}$$

What follows therefrom is:

$$\begin{pmatrix} M \\ F \\ F_3 \\ F_4 \end{pmatrix} = \begin{bmatrix} d/2 & -d/2 & 0 & 0 \\ 1/2 & 1/2 & 0 & 0 \\ 0 & 0 & 1 & 0 \\ 0 & 0 & 0 & 1 \end{bmatrix}\begin{pmatrix} F_1 \\ F_2 \\ F_3 \\ F_4 \end{pmatrix} \tag{17}$$

$$\Rightarrow \begin{pmatrix} M \\ F \\ F_3 \\ F_4 \end{pmatrix} =$$

-continued $$-\begin{bmatrix} d/2 & -d/2 & 0 & 0 \\ 1/2 & 1/2 & 0 & 0 \\ 0 & 0 & 1 & 0 \\ 0 & 0 & 0 & 1 \end{bmatrix}\begin{bmatrix} K_{11} & K_{12} & K_{13} & K_{14} \\ K_{21} & K_{22} & K_{23} & K_{24} \\ K_{31} & K_{32} & K_{33} & K_{34} \\ K_{41} & K_{42} & K_{43} & K_{44} \end{bmatrix}[T]\begin{pmatrix} \theta \\ x \\ X_3 \\ X_4 \end{pmatrix}$$

$$\Rightarrow \begin{pmatrix} M \\ F \\ F_3 \\ F_4 \end{pmatrix} = -[K']\begin{pmatrix} \theta \\ x \\ X_3 \\ X_4 \end{pmatrix}$$

Hence, the system of equations:

$$\begin{bmatrix} I & 0 & 0 & 0 \\ 0 & m & 0 & 0 \\ 0 & 0 & m_a & 0 \\ 0 & 0 & 0 & m_a \end{bmatrix}\begin{pmatrix} \ddot{\theta} \\ \ddot{x} \\ \ddot{X}_3 \\ \ddot{X}_4 \end{pmatrix} + \begin{bmatrix} k_t & 0 & 0 & 0 \\ 0 & k & 0 & 0 \\ 0 & 0 & 0 & 0 \\ 0 & 0 & 0 & 0 \end{bmatrix}\begin{pmatrix} \theta \\ x \\ X_3 \\ X_4 \end{pmatrix} = \begin{pmatrix} M \\ F \\ F_3 \\ F_4 \end{pmatrix} - [K']\begin{pmatrix} \theta \\ x \\ X_3 \\ X_4 \end{pmatrix} \tag{18}$$

$$\Rightarrow \begin{bmatrix} I & 0 & 0 & 0 \\ 0 & m & 0 & 0 \\ 0 & 0 & m_a & 0 \\ 0 & 0 & 0 & m_a \end{bmatrix}\begin{pmatrix} \ddot{\theta} \\ \ddot{x} \\ \ddot{X}_3 \\ \ddot{X}_4 \end{pmatrix} + \left\{\begin{bmatrix} k_t & 0 & 0 & 0 \\ 0 & k & 0 & 0 \\ 0 & 0 & 0 & 0 \\ 0 & 0 & 0 & 0 \end{bmatrix} + [K']\right\}\begin{pmatrix} \theta \\ x \\ X_3 \\ X_4 \end{pmatrix} = \begin{pmatrix} M \\ F \\ F_3 \\ F_4 \end{pmatrix}$$

It is important to note that the coupling between the coordinates in Equation (18) is due to the matrix [K']. Evaluating the elements of [K'] from equations (4) and (17), the governing equation for the rotation, θ, of the diaphragm is:

$$I\ddot{\theta} + \left(k_t + \left(\frac{d}{2}\right)^2(k_{11} - k_{12} - k_{21} + k_{22})\right)\theta + \left(\frac{d}{2}\right)(k_{11} + k_{12} - k_{21} - k_{22})x + \left(\frac{d}{2}\right)(k_{13} - k_{23})X_3 + \left(\frac{d}{2}\right)(k_{14} - k_{24})X_4 = M \tag{19}$$

where:

$$K_{ij} = -\frac{\rho_0 c^2}{V}A_iA_j.$$

Note that if the diaphragm is symmetric, $A_1=A_2$, and $A_3=A_4$. As a result, the coefficients of x, $X_3$, and $X_4$ in equation (19) become zero. This causes the governing equation for rotation to be independent of the other coordinates as well as independent of the volume, V (i.e., $I\ddot{\theta}+k_t\theta=M$). The rotation is also independent of the area of the slits 114, because of the assumption that the pressure created within the back volume 108 is spatially uniform and therefore does not create any net moment on the diaphragm 102.

In the foregoing analysis, it has been assumed that the microphone diaphragm 102 is symmetric about the central pivot point 106. As mentioned above, in this case, the diaphragm 102 behaves like a differential microphone diaphragm and has a first-order directional response. If, however, the diaphragm 102 is designed to be asymmetrical with respect to pivot point 106, then the directionality departs from that of a differential microphone and tends toward that of a nondirectional microphone. The effect of the back volume

108 on the rotation of the diaphragm 102 can be determined by extending the foregoing analysis to this non-symmetric case.

Figure 5:
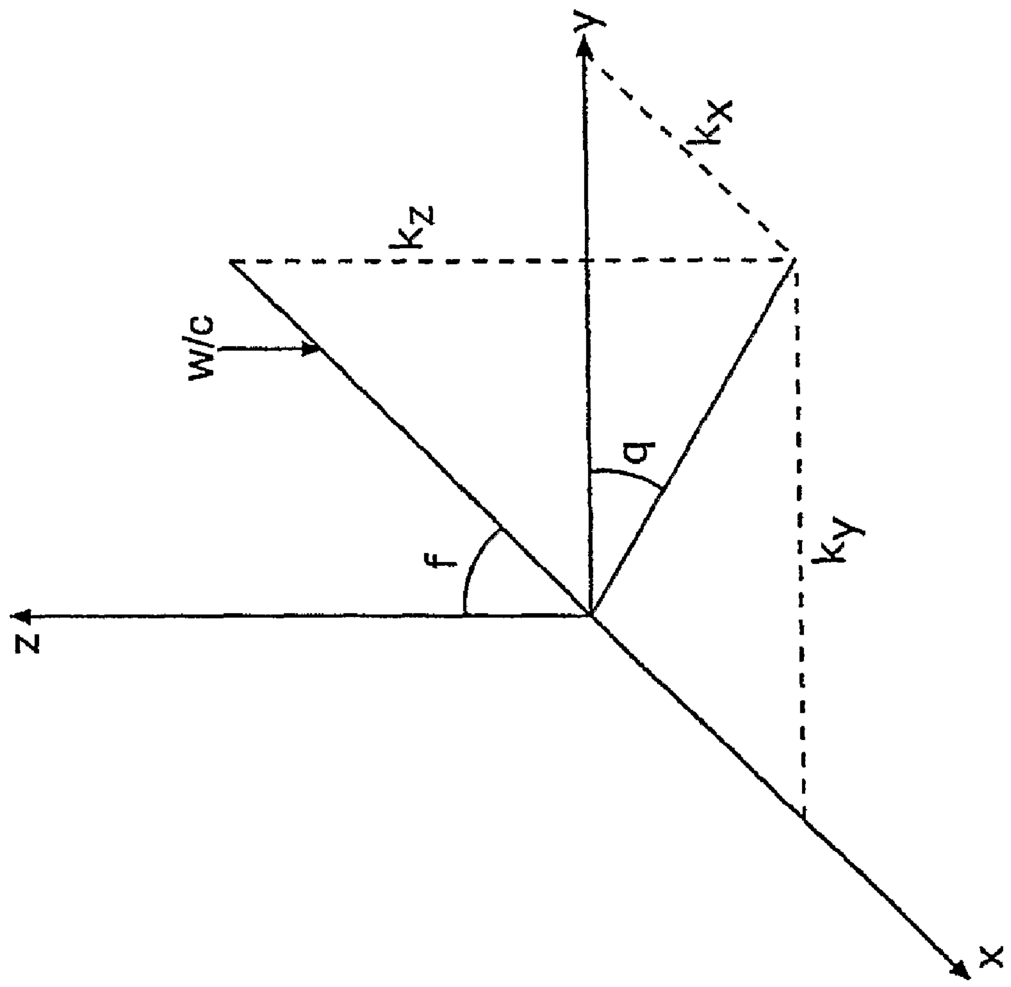
FIG. 5 is a diagram showing the orientation of an incident sound wave on the diaphragm of FIG. 1.

In the following, expressions are derived for the forces and moment that are applied to the microphone diaphragm 102 due to an acoustic plane wave. For plane waves, the pressure acting on the diaphragm 102 is assumed to be of the form $p=Pe^{\hat{i}\omega t}e^{(-\hat{i}k_x x-\hat{i}k_y y)}$, where $$k_x = \frac{\omega}{c}\sin\phi\sin\theta,$$

$$k_y = \frac{\omega}{c}\sin\phi\cos\theta$$

and $$k_z = \frac{\omega}{c}\cos\phi,$$

where the angles are defined in FIG. 5. The net moment due to the incident sound is given by $$M = \int_{-L_x/2}^{L_x/2}\int_{-L_y/2}^{L_y/2} Pe^{\hat{i}\omega t}e^{(-\hat{i}k_x x-\hat{i}k_y y)}x\,dx\,dy$$

where $L_x$ and $L_y$ are the lengths in the x and y directions, respectively.

The expression for the moment can be integrated separately over the x and y directions to give $$\Rightarrow M = Pe^{\hat{i}\omega t}\int_{-L_x/2}^{L_x/2} e^{-\hat{i}k_x x}x\,dx\int_{-L_y/2}^{L_y/2} e^{-\hat{i}k_y y}\,dy.$$

Integrating over the y coordinate $$\text{becomes} \Rightarrow M = Pe^{\hat{i}\omega t}\frac{(e^{\hat{i}k_y L_y/2}-e^{\hat{i}k_y L_y/2}}{-\hat{i}k_y}\int_{-L_x/2}^{L_x/2} e^{-\hat{i}k_x x}x\,dx$$

$$\Rightarrow M = Pe^{\hat{i}\omega t}\frac{2\sin\left(\frac{k_y L_y}{2}\right)}{}\int_{-L_x/2}^{L_x/2} e^{-\hat{i}k_x x}x\,dx.$$

Integrating by parts for the x-component gives:

$$\Rightarrow M = Pe^{\hat{i}\omega t}\frac{2\sin\left(\frac{k_y L_y}{2}\right)}{k_y}\left[\frac{L_x}{2}\frac{(e^{-\hat{i}k_x L_x/2}+e^{\hat{i}k_x L_x/2})}{-\hat{i}k_x}+\frac{1}{k_x^2}(e^{\hat{i}k_x L_x/2}-e^{-\hat{i}k_x L_x/2})\right].$$

Simplifying the above gives:

$$\Rightarrow M = Pe^{\hat{i}\omega t}\left[\frac{2\sin\left(\frac{k_y L_y}{2}\right)}{k_y}\right]\left[-\frac{L_x}{\hat{i}k_x}\cos\left(\frac{k_x L_x}{2}\right)-\frac{2\hat{i}}{k_x^2}\sin\left(\frac{k_x L_x}{2}\right)\right] \tag{20}$$

Because the dimensions of the diaphragm are very small relative to the wavelength of sound, the arguments of the sin and cosine functions are very small, which results in $$\sin\left(\frac{k_y L_y}{2}\right) \approx \frac{k_y L_y}{2}.$$

The second term in brackets in Equation (20) is expanded to second order using Taylor's series. Using $$\cos\theta \approx 1-\frac{\theta^2}{2}$$

and $$\sin\theta \approx \theta-\frac{\theta^2}{6},$$

in Equation (16), $$M \approx Pe^{\hat{i}\omega t}\left[2\left(\frac{L_y}{2}\right)\right]\left[\frac{-L_x}{\hat{i}k_x}\left(1-\frac{k_x^2L_x^2}{8}\right)-\frac{2\hat{i}}{k_x^2}\left(\frac{k_x L_x}{2}-\frac{k_x^3L_x^3}{48}\right)\right].$$

Simplifying gives:

$$M \approx Pe^{\hat{i}\omega t}L_y\frac{k_x L_x^3}{12\hat{i}} \tag{21}$$

The net force is given by a surface integral of the acoustic pressure, $$F = -\int_{-L_x/2}^{L_x/2}\int_{-L_y/2}^{L_y/2} Pe^{\hat{i}\omega t}e^{-\hat{i}k_x x-\hat{i}k_y y}\,dx\,dy.$$

Carrying out the integration gives:

$$F - -Pe^{\hat{i}\omega t}\frac{2\sin\left(\frac{k_x L_x}{2}\right)}{k_x}\frac{2\sin\left(\frac{k_y L_y}{2}\right)}{k_y}.$$

Again, for small angles this becomes $$F=-Pe^{\hat{i}\omega t}(L_xL_y) \tag{22}$$

Using Equations (15), (18) and (19):

$$\begin{bmatrix} I & 0 & 0 & 0 \\ 0 & m & 0 & 0 \\ 0 & 0 & m_a & 0 \\ 0 & 0 & 0 & m_a \end{bmatrix}\begin{pmatrix}\ddot{\theta} \\ \ddot{x} \\ \ddot{X}_3 \\ \ddot{X}_4\end{pmatrix} + \left\{\begin{bmatrix} k_t & 0 & 0 & 0 \\ 0 & k & 0 & 0 \\ 0 & 0 & 0 & 0 \\ 0 & 0 & 0 & 0 \end{bmatrix} + [K']\right\}\begin{pmatrix}\theta \\ x \\ X_3 \\ X_4\end{pmatrix} = \begin{pmatrix} Pe^{\hat{i}\omega t}L_y\frac{k_x L_x^3}{12\hat{i}} \\ -Pe^{\hat{i}\omega t}(L_xL_y) \\ -PA_a \\ -PA_a \end{pmatrix}$$

Let $$K_{eq} = \left\{ \begin{bmatrix} k_t & 0 & 0 & 0 \\ 0 & k & 0 & 0 \\ 0 & 0 & 0 & 0 \\ 0 & 0 & 0 & 0 \end{bmatrix} + [K'] \right\}$$

and assume $\theta = \Theta e^{\hat{i}\omega t}$, $x = Xe^{\hat{i}\omega t}$, $X_3 = X_3 e^{\hat{i}\omega t}$ and $X_4 = X_4 e^{\hat{i}\omega t} \Rightarrow$.

$$\begin{bmatrix} K_{eq}(1,1) - I\omega^2 & K_{eq}(1,2) & K_{eq}(1,3) & K_{eq}(1,4) \\ K_{eq}(2,1) & K_{eq}(2,2) - m\omega^2 & K_{eq}(2,3) & K_{eq}(2,4) \\ K_{eq}(3,1) & K_{eq}(3,2) & K_{eq}(3,3) - m_a\omega^2 & K_{eq}(3,4) \\ K_{eq}(4,1) & K_{eq}(4,2) & K_{eq}(4,3) & K_{eq}(4,4) - m_a\omega^2 \end{bmatrix} \begin{pmatrix} \Theta/P \\ X/P \\ X_3/P \\ X_4/P \end{pmatrix} = \begin{pmatrix} L_y \dfrac{k_x L_x^3}{12\hat{i}} \\ -(L_x L_y) \\ -A_a \\ -A_a \end{pmatrix} \quad (23)$$

Using Equation (23), the displacement and rotation relative to the amplitude of the pressure, X/P and θ/P, as a function of the excitation frequency, ω may be computed.

Based on the foregoing analysis, it may be observed that if the air in the back volume 108 is considered to be in viscid, the performance of the differential microphone diaphragm 102 is not degraded if the depth of the backing cavity 110 is reduced significantly. Thus the microphone 100 can be fabricated without the need for a backside hole behind the diaphragm 102. The fabrication process for the surface micromachined microphone diaphragm is shown in FIGS. 6*a*-6*d*.

Figure 6A:
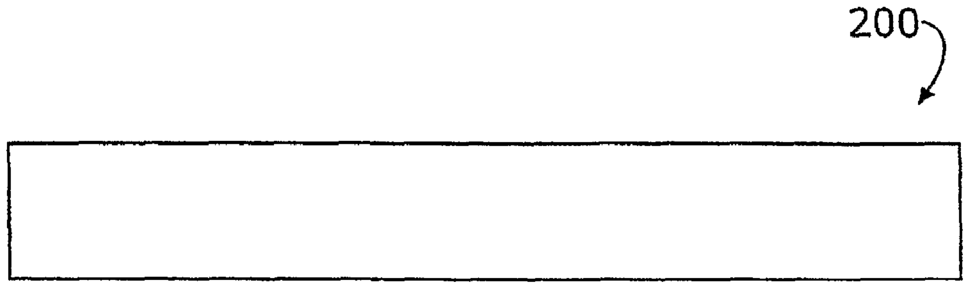
FIGS. 6*a*-6*d* are schematic representations of the stages of fabrication of the inventive, surface micromachined microphone of the invention.

Referring now to FIG. 6*a*, there is shown a bare silicon wafer 200 before fabrication is begun. Such silicon wafers are known to those skilled in the art and are not further described herein.

Figure 6B:
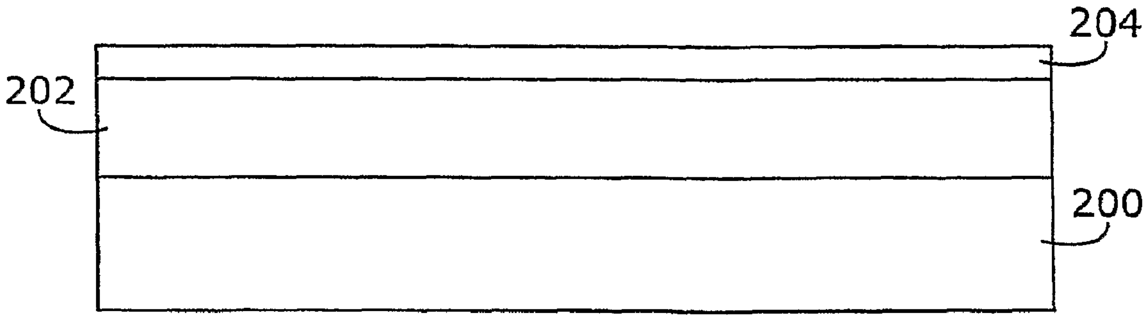

As may be seen in FIG. 6*b*, a sacrificial layer (e.g., silicon dioxide) 202 is deposited on an upper surface of wafer 200. While silicon dioxide has been found suitable for forming sacrificial layer 202, many other suitable material are know to those of skill in the art. For example, low temperature oxide (LTO), phosphosilicate glass (PSG), aluminum are known to be suitable. Likewise, photoresist material may be used. In still other embodiments, polymeric materials may be used to form sacrificial layer 202. It will be recognized that other suitable material may exist. The choice and use of such material is considered to be known to those of skill in the art and is not further described herein. Consequently, the invention is not considered limited to a specific sacrificial layer material. Rather, the invention covers any suitable material used to form a sacrificial layer in accordance with the inventive method.

Over sacrificial layer 202, a layer of structural material (for example polysilicon) is also deposited. While polysilicon has been found suitable for the formation of layer 204, it will be recognized that layer 204 may be formed from other materials. For example, silicon nitride, gold, aluminum, copper or other material having similar characteristic may be used. Consequently, the invention is not limited to the specific material chosen for purposes of disclosure but covers any and all similar, suitable material. Layer 204 will ultimately form diaphragm 102 (FIG. 2).

Figure 6C:
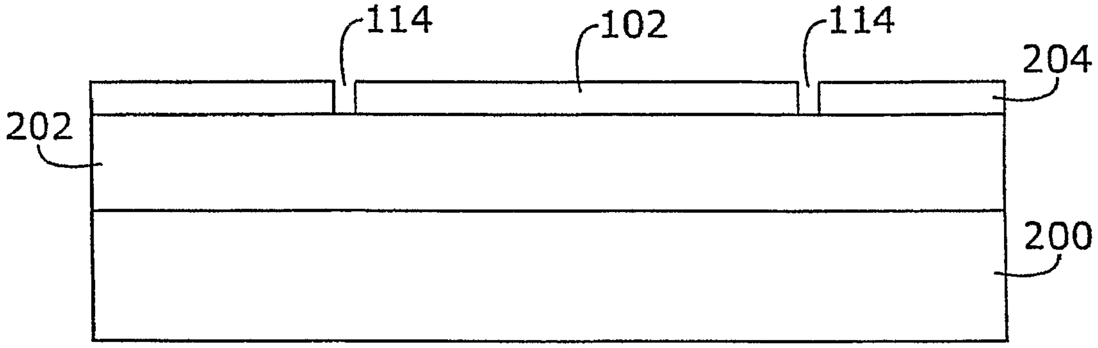

As is shown in FIG. 6*c*, the diaphragm material, layer 204 is next patterned and etched to form the diaphragm 102, leaving slits 114.

Figure 6D:
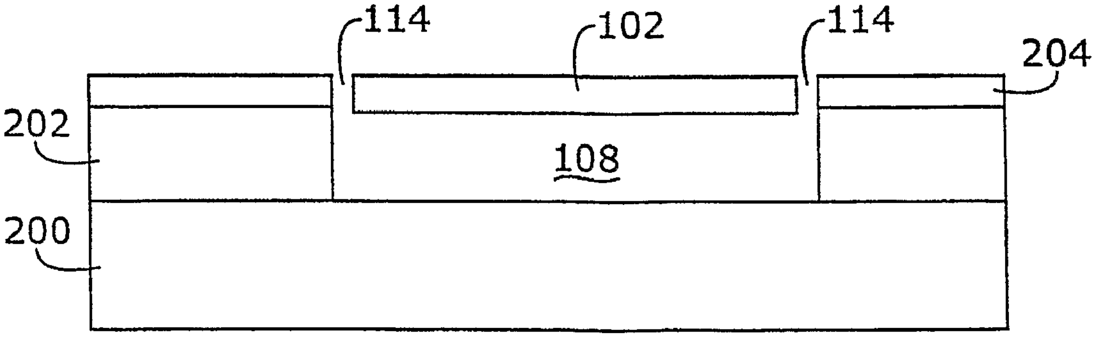

Finally, as may be seen in FIG. 6*d*, the sacrificial layer 202 under diaphragm 102 is removed leaving cavity 110. After the removal of the sacrificial layer, the microphone diaphragm

102 has a back volume 108 with a depth equal to the thickness of the sacrificial layer 202. The microphone is shown schematically in FIG. 7.

To convert motion of diaphragm 102 into an electronic signal, comb fingers incorporated at 208 (FIG. 7) may be integrated with the diaphragm. Such comb or interdigitated fingers are described in detail in copending U.S. patent application Ser. No. 11/198,370 for COMB SENSE MICROPHONE, filed Aug. 5, 2005.

Figure 7:
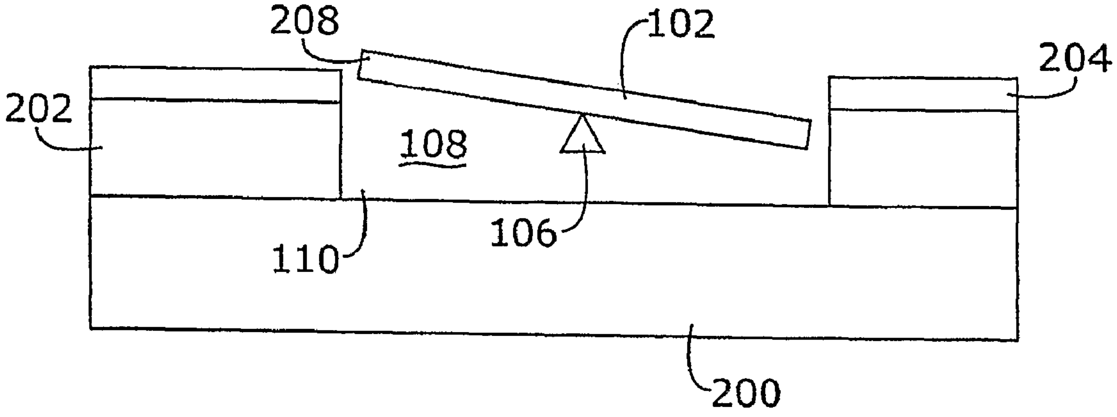
FIG. 7 is a side, sectional, schematic view of a differential microphone formed by removing a portion of a sacrificial layer of FIG. 6*d*.
Figure 8:
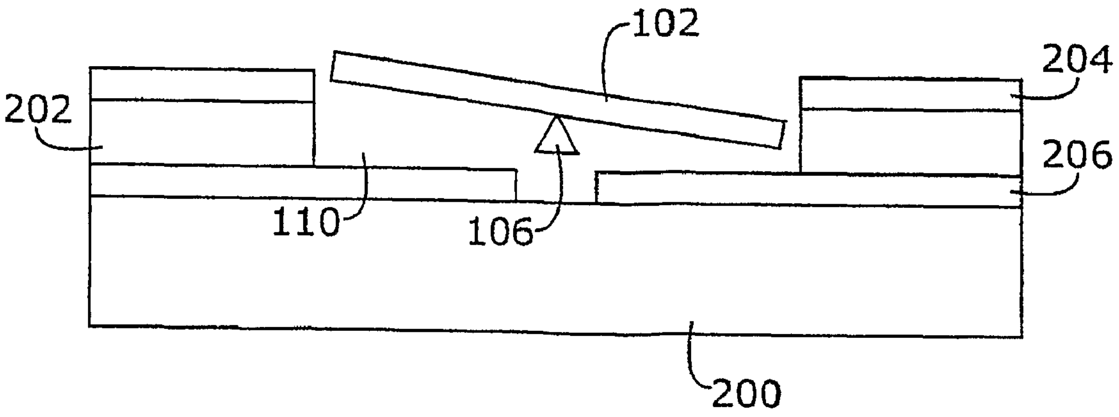
FIG. 8 is a side, sectional, schematic view of an alternate embodiment of the microphone of FIG. 2.

As an alternative sensing scheme, the fundamental microphone structure of FIG. 7 may be modified slightly to include two conductive layers 206 disposed between silicon chip 200 and additional conductive layer 204 to form back plates forming fixed electrodes of capacitors. These back plates are electrically separated from each other in order to allow differential capacitive sensing of the diaphragm motion.

It should be noted that one could employ both the comb fingers 208 and the back plate 206 to perform capacitive sensing. In this case, in addition to serving as an element of a capacitive sensing arrangement, a voltage applied to comb sense fingers 208 may be used to stabilize diaphragm 102. The voltage applied between the comb fingers and the diaphragm can be used to reduce the effect of the collapse voltage, which is a common design issue in conventional back plate-based capacitive sensing schemes.

It will be recognized that many other sensing arrangements may be used to convert motion of diaphragm 102 to an electrical signal. Consequently, the invention is not limited to any particular diaphragm motion sensing arrangement.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of forming a miniature, surface micromachined, differential microphone, the steps comprising:

a) depositing a sacrificial layer on a top surface of a silicon wafer;

b) depositing a diaphragm material on an upper surface of said sacrificial layer;

c) etching said diaphragm material layer to isolate a diaphragm therein; and d) removing at least a portion of said sacrificial layer from a region beneath said defined diaphragm, further comprising at least one of:

forming comb sense fingers along at least a portion of a perimeter of said diaphragm as a sub-step of etching step (c); and forming a conductive layer intermediate said top surface of said silicon wafer and said sacrificial layer.

2. The method as recited in claim 1, wherein said etching step (c) further comprises the sub-step of forming comb sense fingers along at least a portion of a perimeter of said diaphragm.

3. The method as recited in claim 1, the steps comprising:

e) forming a conductive layer intermediate said top surface of said silicon wafer and said sacrificial layer.

4. The method as recited in claim 1, wherein said depositing step (a) comprises depositing a layer of at least one material from the group: silicon dioxide, low temperature oxide (LTO), phosphosilicate glass (PSG), aluminum, photoresist material, a polymeric material.

5. The method as recited in claim 1, wherein said depositing step (b) comprises depositing a layer of at least one material from the group:

polysilicon, silicon nitride, gold, aluminum, and copper.

6. A miniature, surface micromachined, differential microphone, comprising:

a) a silicon substrate;

b) a sacrificial layer deposited upon an upper surface of said silicon substrate;

c) a diaphragm material layer deposited on an upper surface of said sacrificial layer;

d) a diaphragm and supporting hinge formed from said diaphragm material layer, said diaphragm being isolated from a surrounding portion of said diaphragm material layer except at said hinge by a slit formed in the diaphragm material layer adjacent a perimeter of said diaphragm;

e) an enclosed back volume beneath said diaphragm having a depth defined by a thickness of said sacrificial layer, said back volume communicating with a region external thereto only via said slit; and at least one of: a plurality of comb sense fingers disposed along at least a portion of a perimeter of said diaphragm, and a conductive layer intermediate said upper surface of said silicon substrate and said upper surface of said sacrificial layer.

7. The miniature, surface micromachined, differential microphone as recited in claim 6, further comprising:

f) a plurality of comb sense fingers disposed along at least a portion of a perimeter of said diaphragm.

8. The miniature, surface micromachined, differential microphone as recited in claim 6, further comprising:

f) a conductive layer intermediate said upper surface of said silicon substrate and said upper surface of said sacrificial layer.

9. The miniature, surface micromachined, differential microphone as recited in claim 6, wherein said sacrificial layer comprises at least one material from the group: silicon dioxide, low temperature oxide (LTO), phosphosilicate glass (PSG), aluminum, photoresist material, a polymeric material.

10. The miniature, surface micromachined, differential microphone as recited in claim 6, wherein said diaphragm material layer comprises at least one material from the group: polysilicon, silicon nitride, gold, aluminum, and copper.

11. In a miniature, surface micromachined, differential microphone, comprising a diaphragm having a perimeter and a plurality of comb sense fingers disposed along at least a portion of the perimeter formed from a diaphragm material layer and a supporting hinge formed from the diaphragm material layer, and an enclosed back volume beneath said diaphragm and having a side surface and a bottom surface and having a hole in one of said side and said bottom surfaces allowing communication between the back volume and a region external thereto, the improvement comprising:

a) a slit disposed between the perimeter of said diaphragm and a surrounding portion of said diaphragm material layer from which said diaphragm is isolated; and b) the enclosed back volume beneath said diaphragm and having the side surface and the bottom surface, each of the side and said bottom surfaces being isolated from a region external to the enclosed back volume except via said slit.

12. A microphone, comprising:

a substrate, having deposited on a surface thereof a sacrificial layer, and a diaphragm layer disposed on top of said sacrificial layer, an aperture being formed through said diaphragm layer, and at least a portion of said sacrificial layer beneath the diaphragm layer being removed, resulting in a diaphragm with a void between said diaphragm layer and said substrate, wherein said diaphragm has an axis of rotational movement in response to acoustic waves which is substantially parallel to a plane of said diaphragm;

a transducer for producing an electrical signal responsive to a displacement of said diaphragm with respect to said substrate due to acoustic waves, comprising at least one of: a plurality of comb sense fingers disposed along at least a portion of a perimeter of said diaphragm, and a conductive layer intermediate said substrate and said sacrificial layer.

13. The microphone according to claim 12, wherein said axis is located such that respective portions of said diaphragm on either side of the axis of rotational movement reciprocally rotate, in response to an acoustic wave.

14. The microphone according to claim 13, wherein a volume behind said diaphragm is substantially constant with respect to movements in response to acoustic waves.

15. The microphone according to claim 12, wherein a void space behind said diaphragm has a depth approximately the same as a depth of said sacrificial layer.

16. The microphone according to claim 12, wherein said diaphragm has respectively differentially responsive regions, further comprising at least one acoustic barrier to isolate the respectively differentially responsive regions from different portions of an incident acoustic wave.

17. The microphone according to claim 12, wherein said aperture comprises a slit permitting air flow therethrough.

18. The microphone according to claim 17, wherein a moment M acting on one side of said diaphragm with respect to said axis, in response to acoustic waves of amplitude P and frequency ω, having a wavelength larger than a maximum linear dimension of said void, said diaphragm having dimensions $L_y$ along said axis and $L_x$ perpendicular to, and measured from said axis, said acoustic waves deflecting said diaphragm over small angles, is approximately:

$$M \approx P e^{\hat{i}\omega t} L_y \frac{k_x L_x^3}{12\hat{i}}.$$

19. The microphone according to claim 12, wherein said transducer has a first order directional response to acoustic waves.

20. The microphone according to claim 12, wherein said axis is located such respective portions of said diaphragm on either side of the axis of rotational movement reciprocally rotate, and wherein a void volume behind said diaphragm is substantially constant with respect to movements in response to acoustic waves, said aperture comprising a slit permitting air flow therethrough, and a moment M acting on one side of said diaphragm with respect to said axis, in response to acoustic waves of amplitude P and having a wavelength larger than a maximum linear dimension of said void and frequency ω, said diaphragm having dimensions $L_y$ along said axis and $L_x$ perpendicular to, and measured from said axis, said acoustic waves deflecting said diaphragm over small angles, is approximately:

$$M \approx P e^{\hat{i}\omega t} L_y \frac{k_x L_x^3}{12\hat{i}}.$$

* * * * *

UNITED STATES PATENT AND TRADEMARK OFFICE

CERTIFICATE OF CORRECTION

PATENT NO. : 8,276,254 B2
APPLICATION NO. : 12/162992
DATED : October 2, 2012
INVENTOR(S) : Ronald N. Miles It is certified that error appears in the above-identified patent and that said Letters Patent is hereby corrected as shown below:

In the Specification:

Col. 1, line 8: The phrase “may have” should read -- has --.

Signed and Sealed this
Fifth Day of March, 2013

Teresa Stanek Rea
*Acting Director of the United States Patent and Trademark Office*

UNITED STATES PATENT AND TRADEMARK OFFICE

CERTIFICATE OF CORRECTION

| | |
|---|---|
| PATENT NO. | : 8,276,254 B2 |
| APPLICATION NO. | : 12/162992 |
| DATED | : October 2, 2012 |
| INVENTOR(S) | : Ronald N. Miles |

It is certified that error appears in the above-identified patent and that said Letters Patent is hereby corrected as shown below:

In the Specification

Column 1, line 8-9, after the title, the following paragraph should be inserted:

-- STATEMENT OF GOVERNMENT INTEREST --

-- This invention was made with Government support under grant R01 DC005762 awarded by the National Institute of Health. The government has certain rights in this invention. --

Signed and Sealed this
Twenty-ninth Day of April, 2014

Michelle K. Lee
*Deputy Director of the United States Patent and Trademark Office*